Dec. 10, 1957 J. W. EDENS ET AL 2,816,221
BAND AND CHANNEL SWITCHING RECEIVER WITH CAPACITOR CONNECTIBLE EITHER FOR MAIN OR VERNIER TUNING
Filed Oct. 7, 1953
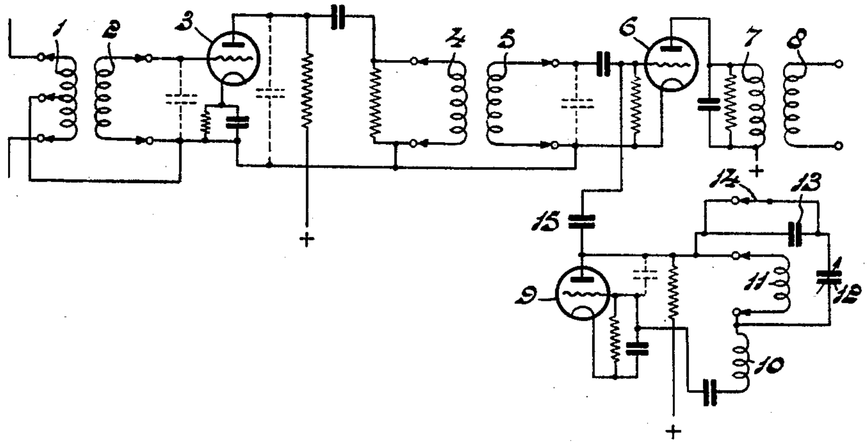
INVENTORS
JAN WIGBOLT EDENS
HEIKO BROEKEMA
BY Fred M Vogel
AGENT 2,816,221

BAND AND CHANNEL SWITCHING RECEIVER WITH CAPACITOR CONNECTIBLE EITHER FOR MAIN OR VERNIER TUNING

Jan Wigbolt Edens and Heiko Broekema, Eindhoven, Netherlands, assignors, by mesne assignments, to North American Philips Company, Inc., New York, N. Y., a corporation of Delaware Application October 7, 1953, Serial No. 384,552

Claims priority, application Netherlands October 10, 1952

1 Claim. (Cl. 250—20)

This invention relates to a television receiver operating on the superheterodyne principle, for example, for the reception of transmissions in the frequency range comprised between 40 and 216 mcs./s. It is known to provide such receivers with a switching member which permits discontinuous tuning to a plurality of television channels. This tuning is commonly effected by changing the inductors of one or more tuned circuits, more particularly of the oscillator circuit, whilst furthermore a circuit connected to the input circuit and allowing passage of the frequency band required for reception is changed for another. In many cases it is furthermore necessary to utilise fine tuning which permits of varying the oscillator frequency within determined narrow limits, so that it can be ensured that the television channel with the sound band, after frequency transformation, is so positioned with respect to the transmission range of the intermediate-frequency band-pass filter that optimum reproduction is obtained. In television receivers with so-called intercarrier sound, a determined variation in oscillator frequency is in many cases desirable to ensure that with uniside-band transmission, if the receiver is located at a comparatively large distance from the transmitter so that the received signal is weak, it is possible to tune to the highest sensitivity, though the image is then of a somewhat lower quality. In receivers not operating with intercarrier sound, the tuning is effected with the aid of the fine tuning in such manner that the intermediate-frequency sound band coincides as far as possible with the transmission range of the intermediate-frequency band-pass filter part intended therefor.

According to the invention, continuous tuning in one or more frequency ranges is obtained by providing the switching member with additional contacts, so that in a determined position thereof a variable capacitor is included at least in the oscillator circuit.

According to the invention, in order to obtain fine control when a television channel is received, the capacitor serving for continuous tuning is so included in the oscillator circuit upon reception of one channel of the range in which the tuning is effected discontinuously so that the ratio between the maximum and minimum capacities of the circuit is considerably smaller than that with continuous tuning, and the total frequency variation enabled by the said capacitor is a fraction only of the total frequency band transmitted. With adjustment for discontinuous tuning, the variable capacitor is preferably connected for this purpose in series with a fixed capacitor.

It is to be noted that it is known as such to reduce the variation range of the capacity of a variable capacitor by connecting fixed capacitors in series and/or in parallel. This is effected, for example, for obtaining so-called band spread in a frequency range located much higher than the frequency range which is normally received. However, when band spread is used, a large number of stations are still received in succession with a complete stroke of the capacitor of high capacity. In the receiver according to the invention the fine tuning is not used for obtaining band spread, but serves for accurate adjustment of a single channel. The total frequency variation of the oscillator which is possible is comparatively small with respect to the transmitted frequency band determined by the band-pass filters. The bands to which tuning is effected continuously are the bands in which frequency-modulated transmitters are operative. As a rule, the television channels are located in the frequency spectrum on each side thereof.

In order that the invention may be readily carried into effect, it will now be described with reference to the accompanying drawing showing, by way of example, that part of the circuit of a receiver which is essential to the invention.

Assuming that the receiver is designed for discontinuous tuning in the television band which extends between 44 and 67 mcs./s. and which comprises four channels, furthermore for reception of the band for frequency-modulated transmitters comprised between 86.5 and 100 mcs./s., in which band the tuning is effected continuously and which is divided into two parts with a limiting frequency of 94 mcs./s. by switching-over the input band-pass filters and the oscillator coil, whilst reception is possible of the television band between 174 and 216 mcs./s., which comprises six channels. In the last-mentioned band also the tuning is effected discontinuously, that is to say by switching-over the input band-pass filters and the inductor of the oscillator circuit, similarly as in the first-mentioned band.

Referring now to the figure, the reference numeral 1 indicates the aerial coil which is inductively coupled to a coil 2 connected between cathode and control grid of a first high-frequency amplifying tube 3. Said coils, together with the parasitic capacities connected in parallel therewith, constitute a first circuit. As shown in the figure, they may be changed for others, which are preferably affected in the usual manner with the use of a drum-shaped rotary switching member, to which the various coils are secured. One set of coils 1 and 2 is associated with each television channel and also with each of the two parts of the band of frequency-modulated transmission. The output circuit of the high-frequency amplifying tube 3 comprises a coil 4 which, together with a coil 5 and the parasitic capacities connected in parallel therewith, constitute a band-pass filter which is changeable with the aid of the said switching member and which in any position of this member transmits approximately the same frequency range as the circuit constituted by the coils 1 and 2 and the associated capacities. If necessary for widening the frequency band transmitted, it is possible for resistors to be connected in parallel with the coils. Said band has a width of about 6 mcs./s. for reception of the television stations.

The tube 6 serves as a mixing tube in which an intermediate-frequency oscillation is produced and of which the output circuit comprises a circuit 7 which is tuned to the intermediate-frequency carrier wave and which constitutes, together with a circuit 8 from which the intermediate-frequency oscillations are derived, an intermediate-frequency band-pass filter which passes a frequency range corresponding to the width of the band required.

The tube 9 serves as the local oscillator. For this purpose, the anode and the control grid are separated by a circuit tunable to the oscillator frequency and the inductor of which is constituted by two parts 10 and 11, the latter of which is changed for another inductor upon each passage to another channel or another frequency band. Parallel to this part is always connected the series-combination of a variable capacitor 12 and a fixed capacitor 13. The latter may be short circuited by way of a switch 14 forming part of the said switching member.

The switch 14 is always open when a television channel is received, and it is closed if tuning is effected in one of the bands for the frequency-modulated transmissions. In the latter case the total variation in the capacity of the oscillator circuit is maximum and the whole range desired can readily be covered. The capacity of fixed capacitor 13 is preferably some times higher than the maximum capacity of capacitor 12, so that a variation in the position of capacitor 12 results only in a small variation of the total capacity of the circuit when television transmissions are received. It is thus possible that upon reception of a television transmission capacitor 12 may serve for fine control to ensure that the intermediate-frequency band substantially coincides with the transmission range of the intermediate-frequency band-pass filter. The width of the range over which the frequency of the oscillator in this case requires to be varied will commonly be a fraction only of the width of the transmitted frequency range determined by the circuits 1, 2 and 4, 5 and by the intermediate-frequency band-pass filter. With suitable proportioning of the non-changeable part 10 of the inductor of the circuit it may be ensured that the variation in all television channels is approximately the same. As a rule, satisfactory fine control may be obtained if the maximum variation obtainable by means of the series-combination of the capacitors 12 and 13 is from 1 to 2 mcs./s.

In receivers operating with intercarrier sound 0.5 mc./s. is sufficient and in other receivers this value may, as a rule, be 1.5 mcs./s. The voltage of the local oscillator is supplied by a capacitor 15 to the control grid of mixing tube 6.

The device is extremely simple, since the rotary switching member requires only a single additional contact (14).

What is claimed is:

In a television receiver operating on the superheterodyne principle and provided with an oscillatory circuit, the combination comprising a switching member having a plurality of positions for tuning said receiver discontinuously to a plurality of television channels, each channel having a substantially identical predetermined frequency bandwith, and at least one frequency modulation band located between two of said television channels and having substantially the same bandwith as that of each of said television channels, each of said bands comprising a plurality of frequency modulation channels, said oscillatory circuit having a variable capacitor device and means coupled to said switching member to change the ratio between maximum and minimum capacitance of said device to provide a relatively small ratio for effecting fine tuning over a small portion of said frequency bandwidth during the reception of said television channels and to provide a relatively large ratio for effecting continuous tuning throughout said frequency bandwidth during the reception of any one of said frequency modulation bands, and an oscillator coil having two parts connected in series, one of said parts being changeable, said changeable part being connected in parallel with said variable capacitor device and being tuned thereby, the tuning of the remaining said part of the coil being relatively unaffected by said variable capacitor device.

References Cited in the file of this patent

UNITED STATES PATENTS

| | | |
|---|---|---|
| 2,434,299 | Van Loon | Jan. 13, 1948 |
| 2,545,681 | Zepp et al. | Mar. 20, 1951 |
| 2,551,228 | Achenbach | May 1, 1951 |
| 2,558,454 | Neinaber et al. | June 26, 1951 |